US012713546B2

(12) United States Patent
Zhu et al.

(10) Patent No.: US 12,713,546 B2
(45) Date of Patent: Aug. 18, 2026

(54) FLEXIBLE DISPLAY DEVICE

(71) Applicant: BOE Technology Group Co., Ltd., Beijing (CN)

(72) Inventors: Hong Zhu, Beijing (CN); Youqing Shen, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 110 days.

(21) Appl. No.: 18/860,808

(22) PCT Filed: Aug. 18, 2023

(86) PCT No.: PCT/CN2023/113750
§ 371 (c)(1),
(2) Date: Oct. 28, 2024

(87) PCT Pub. No.: WO2024/041457
PCT Pub. Date: Feb. 29, 2024

(65) Prior Publication Data

US 2025/0318059 A1 Oct. 9, 2025

(30) Foreign Application Priority Data

Aug. 26, 2022 (CN) ......................... 202211035253.3

(51) Int. Cl.
*H05K 5/02* (2006.01)

(52) U.S. Cl.
CPC ................................. *H05K 5/0217* (2013.01)

(58) Field of Classification Search
CPC ........................... H05K 5/0017; H05K 5/0217
(Continued)

(56) References Cited

U.S. PATENT DOCUMENTS 10,747,269 B1 * 8/2020 Choi ..................... G06F 1/1652
2019/0141849 A1 5/2019 Xu et al.
(Continued)

FOREIGN PATENT DOCUMENTS

CN 109268652 A 1/2019
CN 209743958 U 12/2019
(Continued)

OTHER PUBLICATIONS

International Search Report mailed on Oct. 2, 2023, received for PCT Application PCT/CN2023/113750, filed on Aug. 18, 2023, 5 pages including English Translation.
(Continued)

*Primary Examiner* — Hung S. Bui
(74) *Attorney, Agent, or Firm* — XSENSUS LLP

(57) ABSTRACT

A flexible display device includes a fixed structure, including a first fixed housing; a sliding mechanism, including a display module, a connecting frame and a rolling shaft, where the connecting frame includes an installation part, and the installation part is spaced apart from and arranged at a side of the first fixed housing along a first direction; and a driving support mechanism, including at least one driving mechanism, a first guiding member and at least one support bracket, where the support bracket includes at least one support unit, the support unit includes a first connecting member, one end of the first connecting member is hingedly connected to the connecting frame, another end of the first connecting member is slidably connected to the first guiding member, and an angle between the first connecting member and the first guiding member is not equal to 90 degrees.

17 Claims, 7 Drawing Sheets

(58) Field of Classification Search
USPC .......................................................... 361/807
See application file for complete search history.

(56) References Cited

U.S. PATENT DOCUMENTS

| | | | | |
|---|---|---|---|---|
| 2022/0167512 A1* | 5/2022 | Ahn | ...................... | G06F 1/1624 |
| 2022/0238047 A1* | 7/2022 | Shin | .................... | H04M 1/0268 |

FOREIGN PATENT DOCUMENTS

| | | | |
|---|---|---|---|
| CN | 111833748 | A | 10/2020 |
| CN | 112951085 | A | 6/2021 |
| CN | 113035080 | A | 6/2021 |
| CN | 113176813 | A | 7/2021 |
| CN | 111480190 | B | 4/2022 |
| CN | 115311947 | A | 11/2022 |
| JP | 2005215648 | A | 8/2005 |

OTHER PUBLICATIONS

Written Opinion mailed on Oct. 2, 2023, received for PCT Application PCT/CN2023/113750, filed on Aug. 18, 2023, 10 pages including English Translation.

* cited by examiner

FLEXIBLE DISPLAY DEVICE

CROSS-REFERENCE TO RELATED APPLICATIONS

The present disclosure is a U.S. National Phase Application of International Application No. PCT/CN2023/113750, filed on Aug. 18, 2023, which claims the priority to the Chinese Patent Application No. 202211035253.3, entitled "FLEXIBLE DISPLAY DEVICE", filed on Aug. 26, 2022, the entire contents of both of which are incorporated herein by reference for all purposes.

TECHNICAL FIELD

The present disclosure relates to the field of display technologies and, specifically, to a flexible display device.

BACKGROUND

Flexible display screens have good folding and bending performance, and display areas of a portion of flexible display devices can be changed according to requirement of users in different scenarios, which has become an important development direction of flexible display in the future.

In existing flexible display devices, a driving part and a support part of a display module are separately arranged, which is structurally complex and occupies a large space, and is not conducive to lightening and thinning of the flexible display device.

It should be noted that the information disclosed in the above-described background section is only used to enhance understanding of the background of the present disclosure, and thus may include information that does not constitute prior art known to those ordinary skilled in the art.

SUMMARY

The present disclosure provides a flexible display device.

According to an aspect of the present disclosure, there is provided a flexible display device, including a fixed structure, a sliding mechanism and a driving support mechanism. The fixed structure includes a first fixed housing. The sliding mechanism includes a display module, a connecting frame and a rolling shaft, where the connecting frame includes an installation part, the installation part is spaced apart from and arranged at a side of the first fixed housing along a first direction, the rolling shaft is rotatably connected to the connecting frame, and the display module is wound around the rolling shaft and connected to the first fixed housing. The driving support mechanism includes a driving mechanism, a first guiding member and a support bracket, where the first guiding member is arranged between the first fixed housing and the connecting frame, a fixed part of the driving mechanism is installed on the first fixed housing, a movable part of the driving mechanism is fixedly connected to the first guiding member, the support bracket includes at least one support unit, the support unit includes a first connecting member, one end of the first connecting member is hingedly connected to the connecting frame, another end of the first connecting member is slidably connected to the first guiding member, and an angle between the first connecting member and the first guiding member is not equal to 90 degrees.

In an embodiment of the present disclosure, the support unit further includes a second connecting member, one end of the second connecting member is rotatably connected to the another end of the first connecting member, a slider is provided at a connection between the second connecting member and the first connecting member, the slider is slidably connected to the first guiding member, another end of the second connecting member is hingedly connected to the first fixed housing, and an angle between the second connecting member and the first guiding member is not equal to 90 degrees.

In an embodiment of the present disclosure, the first fixed housing is provided with a first connecting part, the connecting frame is provided with a second connecting part, the support bracket includes two support units, first connecting members of the two support units are hingedly connected to the second connecting part, and second connecting members of the two support units are hingedly connected to the first connecting part.

In an embodiment of the present disclosure, the driving support mechanism includes a plurality of support brackets, the plurality of the support brackets are arranged sequentially along a second direction, and the second direction is perpendicular to the first direction.

In an embodiment of the present disclosure, a distance between two adjacent first connecting parts is greater than or equal to a sum of lengths of two first connecting rods, a distance between two adjacent second connecting parts is greater than or equal to a sum of lengths of two second connecting rods, and the first connecting rod and the second connecting rod have equal lengths.

In an embodiment of the present disclosure, the sliding mechanism further includes a flexible support plate, the flexible support plate is fixed to the display module, and the flexible support plate is located partially between the support bracket and the display module and partially between the rolling shaft and the display module.

In an embodiment of the present disclosure, the connecting frame further includes connecting arms, the connecting arms are arranged at two sides of the installation part along the second direction and extend along the first direction towards a side close to the first fixed housing, track plates are arranged at two sides of the connecting arms, a guiding strip is arranged at a side of the track plate close to the connecting arm, a guiding member is slidably connected to the guiding strip, and the guiding member is fixedly connected to the flexible support plate.

In an embodiment of the present disclosure, the sliding mechanism further includes a sliding housing, the sliding housing includes an arc-shaped plate, the arc-shaped plate is located at a side of a curled part of the display module away from the rolling shaft, connecting structures are provided at two ends, in the second direction, of the arc-shaped plate respectively, and the connecting structure extends along the first direction and is connected to the track plate and/or the connecting arm.

In an embodiment of the present disclosure, the connecting structure includes a first connecting plate and a second connecting plate, the first connecting plate is arranged at a side of the track plate away from the connecting arm, the second connecting plate is arranged at an outer edge of the first connecting plate and located at a side of the display module away from the flexible support plate, and the second connecting plate covers a partial edge of the display module.

In an embodiment of the present disclosure, the sliding mechanism further includes a cover plate, the cover plate is arranged, along a third direction, at a side of the sliding housing away from the first fixed housing, the third direction is perpendicular to the first direction and the second direction, and the display module extends from the rolling shaft to an area between the flexible support plate and the cover plate.

In an embodiment of the present disclosure, the fixed structure further includes a second fixed housing, the second fixed housing is arranged at a side of the driving support mechanism away from the first fixed housing, the second fixed housing includes a first part, an adapter part and a second part, the first part is fixedly connected to the first fixed housing, the adapter part is connected to the first part and extends along the third direction towards the first fixed housing, the second part is connected to an end of the adapter part close to the first fixed housing, and the display module is located between the cover plate and the second part in the third direction.

In an embodiment of the present disclosure, along the second direction, branch edges are provided at two sides of the second fixed housing, the branch edge is located in a same plane as the first part, and the second connecting plate is connected to a side of the branch edge close to the first fixed housing.

In an embodiment of the present disclosure, the fixed structure further includes a first cover housing and a second cover housing, the first cover housing and the second cover housing are fixedly connected to the first fixed housing, the first cover housing is located at two sides of the first fixed housing along the second direction and is at least partially overlapped with the first connecting plate, and the second cover housing is partially arranged at a side of the display module away from the first fixed housing and covers a portion of an edge of the display module not covered by the second connecting plate.

In an embodiment of the present disclosure, a chute is provided at a side of the connecting structure away from the track plate along the second direction, and the first cover housing is matched in the chute.

In an embodiment of the present disclosure, the driving mechanism includes a motor and a driving member, the motor is arranged on the first fixed housing, one end of the driving member is threadedly connected to a rotation shaft of the motor, and another end of the driving member is fixedly connected to the first guiding member.

In an embodiment of the present disclosure, the driving mechanism further includes a second guiding member, the second guiding member is connected to the first fixed housing, the second guiding member extends along the first direction, and the driving member is slidably connected to the second guiding member.

In an embodiment of the present disclosure, the driving support mechanism includes at least one pair of driving mechanisms, one pair of driving mechanisms includes two driving mechanisms, the two driving mechanisms of each pair of driving mechanisms are symmetrically arranged about a center line, along the first direction, of the first fixed housing.

The flexible display device of the present disclosure includes the driving support mechanism and the sliding mechanism, the driving support mechanism includes the driving mechanism, the first guiding member and the support bracket, and the sliding mechanism includes the display module, the connecting frame and the rolling shaft. When the movable part of the driving mechanism drives the first guiding member to move, the first connecting member slides on the first guiding member, causing that the angle between the first connecting member and the first guiding member and the distance between the first guiding member and the connecting frame are changed, and at this time, the rolling shaft installed on the connecting frame drives, in a rolling friction manner, the display module to slide. When the driving mechanism drives the sliding mechanism to move, the support bracket provides support performance for the display module all the time, and the support bracket is simple in structure and does not occupy excess space. The stroke of the support bracket is twice the stroke of the movable part of the driving mechanism, and the stroke of the display module is twice the stroke of the support bracket. Therefore, the stroke of the driving mechanism is only one-fourth of the stroke of the display module, and the requirement for the stroke of the driving mechanism is relatively low.

It should be understood that the above general description and the subsequent detailed description are merely exemplary and explanatory, and do not limit the present disclosure.

BRIEF DESCRIPTION OF THE DRAWINGS

The accompanying drawings herein, which are incorporated into and form a part of the specification, illustrate embodiments consistent with the present disclosure and are used in conjunction with the specification to explain the principles of the present disclosure. It will be apparent that the accompanying drawings in the following description are only some of the embodiments of the present disclosure, and that other accompanying drawings may be obtained based on these accompanying drawings without creative labor for those ordinary skilled in the art.

DETAILED DESCRIPTION

Figure 1:
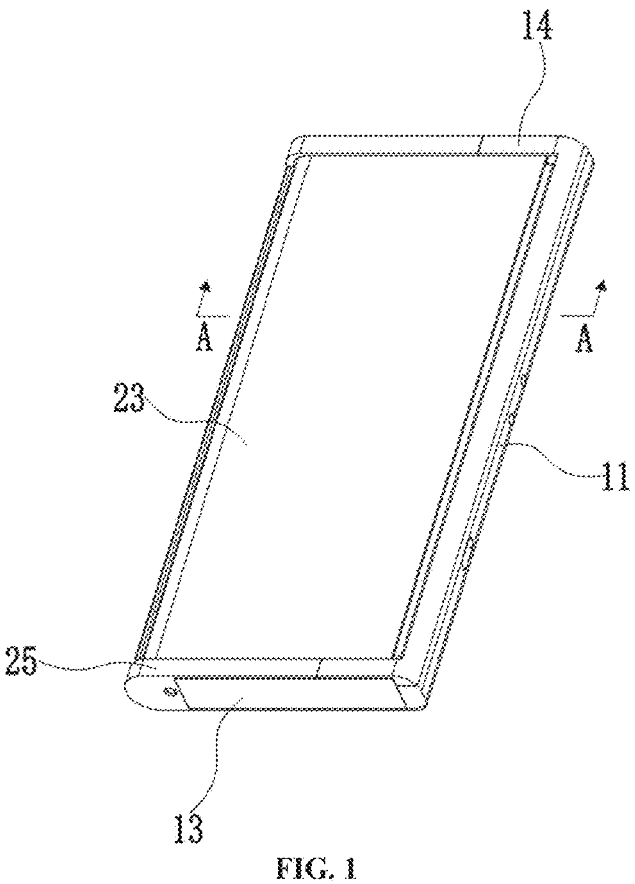
FIG. 1 is a schematic structural diagram of a flexible display device when it is folded involved in an embodiment of the present disclosure.

Exemplary embodiments are now described more comprehensively with reference to the accompanying drawings. However, the exemplary embodiments are capable of being implemented in a variety of forms and should not be construed as being limited to the embodiments set forth herein. Rather, the provision of these embodiments allows for the present disclosure to be comprehensive and complete, and conveys the idea of the exemplary embodiments in a comprehensive manner to those skilled in the art. The same reference numerals in the drawings indicate the same or similar structures, and therefore their detailed descriptions will be omitted. In addition, the accompanying drawings are only schematic illustrations of the present disclosure and are not necessarily drawn to scale.

Although relative terms such as "up" and "down" are used in this specification to describe the relative relationship between one component and another component indicated in the drawings, these terms are used in this specification only for convenience, e.g., in accordance with the direction of the example described in the accompanying drawing. It can be understood that if the device indicated in the drawing is flipped upside down, the component described as being "up" will become the component described as being "down". When a certain structure is "on" another structure, it may mean that the certain structure is integrally formed on the another structure, or that the certain structure is "directly" arranged on the another structure, or that the certain structure is "indirectly" arranged on the another structure through yet another structure.

The terms "a", "an", "the", "said", and "at least one" are used for indicating an existence of one or more elements/components/etc.; and the terms "include" and "have" are used for indicating an open-ended inclusion and mean that there may be additional elements/components/etc. in addition to the listed elements/components/etc. The terms "first", "second" and "third", etc. are used merely as markers but not as quantitative limitations to the objects thereof.

The embodiments of the present disclosure provide a flexible display device. As shown in FIGS. 1 to 10, the flexible display device includes a fixed structure, a sliding mechanism and a driving support mechanism. The fixed structure includes a first fixed housing 11. The sliding mechanism includes a display module 23, a connecting frame 21 and a rolling shaft 22. The connecting frame 21 includes an installation part 211. The installation part 211 is spaced apart from and arranged at a side of the first fixed housing 11 along a first direction. The rolling shaft 22 is rotatably connected to the connecting frame 21. The display module 23 is wound around the rolling shaft 22 and connected to the first fixed housing 11. The driving support mechanism includes a driving mechanism 31, a first guiding member 32 and a support bracket 33. The first guiding member 32 is arranged between the first fixed housing 11 and the connecting frame 21. A fixed part of the driving mechanism 31 is installed on the first fixed housing 11, and a movable part of the driving mechanism 31 is fixedly connected to the first guiding member 32. The support bracket 33 includes at least one support unit 331. The support unit 331 includes a first connecting member 3311. One end of the first connecting member 3311 is hingedly connected to the connecting frame 21, and another end of the first connecting member 3311 is slidably connected to the first guiding member 32. An angle between the first connecting member 3311 and the first guiding member 32 is not equal to 90 degrees.

When the movable part of the driving mechanism 31 drives the first guiding member 32 to move, the first connecting member 3311 slides on the first guiding member 32, causing that the angle between the first connecting member 3311 and the first guiding member 32 and the distance between the first guiding member 32 and the connecting frame 21 are changed, and at this time, the rolling shaft 22 installed on the connecting frame 21 drives, in a rolling friction manner, the display module 23 to slide. When the driving mechanism 31 drives the sliding mechanism to move, the support bracket 33 provides support performance for the display module 23 all the time, and the support bracket 33 is simple in structure and does not occupy excess space. The stroke of the support bracket 33 is twice the stroke of the movable part of the driving mechanism 31, and the stroke of the display module 23 is twice the stroke of the support bracket 33. Therefore, the stroke of the driving mechanism 31 is only one-fourth of the stroke of the display module 23, and the requirement for the stroke of the driving mechanism 31 is relatively low.

As shown in FIGS. 3 to 6, the flexible display device includes a fixed structure, the fixed structure includes a first fixed housing 11, and the first fixed housing 11 is a rectangular structure. The first fixed housing 11 includes a first fixed plate 111, a first blocking strip 112 and two first blocking bars 113. The first fixed plate 111 includes two first edges parallel to each other and two second edges parallel to each other. The length of the first edge is greater than the length of the second edge. The first edge extends along a second direction, and the second edge extends along a first direction, where the second direction is perpendicular to the first direction. The blocking strip is arranged on one of the first edges of the first fixed plate 111, and the two first blocking bars 113 are arranged on the two second edges of the first fixed plate 111 respectively. The first blocking strip and the two first blocking bars 113 extend along a third direction, where the third direction is perpendicular to the first direction and the second direction. It should be noted that the first direction is the x direction in FIG. 1, the second direction is the y direction in FIG. 1, and the third direction is the z direction in FIG. 1.

The flexible display device further includes a sliding mechanism, and the sliding mechanism includes a display module 23 and a connecting frame 21. The connecting frame 21 includes an installation part 211, and the installation part 211 is spaced apart from and arranged at a side of the first fixed housing 11 along the first direction. A plurality of rolling shafts 22 are provided on the installation part 211. The plurality of the rolling shafts 22 are rotatably connected to the installation part 211. The plurality of the rolling shafts are distributed at intervals along the second direction, with an equal distance between two adjacent ones of the rolling shafts 22. The display module 23 is wound on the rolling shaft 22. The display module 23 includes a first flat part 232, a curled part 231 and a second flat part 233. A portion of the first flat part 232 is connected to the first fixed housing 11, and extends from the first fixed housing 11 to the rolling shaft 22. The curled part 231 is wound around the plurality of the rolling shafts 22, and extends from the rolling shaft 22 to a side of the installation part 211 that is away from the first fixed plate 111 in the third direction. The second flat part 233 extends along the first direction towards a direction close to the first fixed housing 11.

The installation part 211 is provided with a spacer part 2112 between two adjacent rolling shafts 22. The spacer part 2112 is provided in a circular arc shape. The radian of the spacer part 2112 is substantially the same as the radian of the circumference of the rolling shaft 22. A connection structure may be provided on the installation part 211, and the spacer part 2112 is detachably connected to the installation part 211 through the connection structure. When the display module 23 is impacted by an external force, the spacer part plays a certain support role for the display module 23. It should be emphasized that the rolling shaft 22 may be slightly protruded, along a first direction, with respect to the spacer part 2112, ensuring that the display module 23 is always in contact with the rolling shaft 22 and not in contact with the spacer part during the sliding process. This not only provides the support role but also reduces the friction force experienced by the display module 23 during the folding and unfolding process.

When the connecting frame 21 moves along the first direction, the display module 23 moves in the slide winding direction, and the rolling shaft 22 is driven to rotate through the friction force between the display module 23 and the rolling shaft 22. Specifically, when the connecting frame 21 moves away from the first fixed housing 11 along the first direction, the rolling shaft 22 rotates clockwise, the length of the first flat part 232 along the first direction becomes longer, and the length of the second flat part 233 along the first direction is shortened. Because the total length of the display module 23 does not change, the second flat part 233 moves away from the first fixed housing 11 along the first direction. When the connecting frame 21 moves close to the first fixed housing 11 along the first direction, the rolling shaft 22 rotates counterclockwise, the length of the first flat part 232 along the first direction is shortened, and the length of the second flat part 233 along the first direction becomes longer. Because the total length of the display module 23 does not change, the second flat part 233 moves close to the first fixed housing 11 along the first direction.

Because the contact surface between the display module 23 and the rolling shaft 22 is a smooth surface, relative sliding may occur between the two, thereby generating a large friction force and affecting the normal expansion and contraction of the display module 23. In this embodiment, the sliding mechanism further includes a flexible support plate 26, the flexible support plate 26 is fixed to the display module 23, and the flexible support plate 26 is partially located between the rolling shaft 22 and the display module 23. The surface of the flexible support plate 26 is relatively rough, and the rolling shaft 22 is directly in contact with the flexible support plate 26. The flexible support plate 26 changes the sliding friction between the display module 23 and the rolling shaft 22 into the rolling friction, which reduces, in the form of the rolling friction, the friction resistance generated when the relative sliding occurs to the flexible support plate 26.

The connecting frame 21 further includes two connecting arms 212. The connecting arms 212 are arranged at two sides of the installation part 211 in the second direction, and extend along the first direction towards a side close to the first fixed housing 11. Track plates 24 are provided on two sides of the connecting arms 212. The track plate 24 is provided with a position limiting structure 241 at a side of the track plate 24 close to the connecting arm 212. The position limiting structure 241 includes an arc-shaped limiting plate 2411 and two flat limiting plates 2412. The two flat limiting plates 2412 are arranged at intervals along a third direction. The arc-shaped limiting plate 2411 connects ends of the two flat limiting plates 2412 away from the first fixed housing 11. The arc-shaped limiting plate 2411 and the two flat limiting plates 2412 form an installation groove in a surrounding manner. The connecting arm 212 is arranged in the installation groove and fixed to the track plate 24.

A guiding strip 242 is provided at an outer side of the position limiting structure 241. The shape of the guiding strip 242 is similar to the shape of the position limiting structure 241. The guiding strip 242 includes an arc-shaped guiding segment 2421 and two flat guiding segments 2422. The two flat segments are arranged at intervals along a third direction. The arc-shaped guiding segment 2421 connects ends of the two flat guiding segments 2422 away from the first fixed housing 11. A plurality of guiding clips 27 are arranged between the guiding strip 242 and the flexible support plate 26. The guiding clip 27 is slidably connected to the guiding strip 242 and fixedly connected to the flexible support plate 26. The plurality of the guiding clips 27 are uniformly arranged along the edge of the flexible support plate 26. Through cooperation between the guiding clip 27 and the guiding strip 242, the bending shape of the flexible support plate 26 is confined to be the same as the shape of the guiding strip 242, thereby determining the bending shape of the display module 23. The guiding strip 242 can constrain the flexible support plate 26 and the display module 23 in the third direction, and reduce the creased amount of the display module 23 and the cocked amount of the free end of the display module 23 during the slide winding process. The guiding clip 27 may be provided as a hook. The guiding clip 27 bites on the guiding strip 242.

The sliding mechanism further includes a sliding housing 25. The sliding housing 25 includes an arc-shaped plate 251. The arc-shaped plate 251 has a shape similar to the shape of the curled part 231 of the display module 23. The size of the arc-shaped plate 251 in the first direction is slightly larger than the size of the display module 23 in the first direction. The size of the arc-shaped plate 251 in the second direction is slightly larger than the size of the display module 23 in the second direction. The size of the arc-shaped plate 251 in the third direction is slightly larger than the size of the curled part 231 of the display module 23 in the third direction. The arc-shaped plate 251 is located at a side of the curled part 231 of the display module 23 away from the rolling shaft 22, and forms a protection for the side of the curled part 231 of the display module 23 away from the rolling shaft 22. Connecting structures 252 are arranged at two ends, in the second direction, of the arc-shaped plate 251 respectively. The connecting structure 252 extends along the first direction towards the direction close to the first fixed housing 11. The connecting structure 252 is connected to the track plate 24, and the position of the sliding housing 25 is fixed through the track plate 24. When the connecting arm 212 drives the track plate 24 to move along the first direction, the sliding housing 25 also moves along the first direction.

The connecting structure 252 may include a first connecting plate 2521 and a second connecting plate 2522. The second connecting plate 2522 is integrally formed with the first connecting plate 2521. The first connecting plate 2521 is a flat structure, and the size of first connecting plate 2521 in the third direction is slightly larger than the distance between the side of the first flat part 232 and the side of the second flat part 233 of the display module 23 that are away from each other. The first connecting plate 2521 is arranged at a side of the track plate 24 away from the connecting arm 212. The second connecting plate 2522 includes an arc-shaped connecting section and two flat connecting sections. The two flat connecting sections are arranged at intervals. The arc-shaped connecting section connects ends of the two flat connecting sections that are away from the first fixed housing 11. The second connecting plate 2522 is arranged at an outer edge of the first connecting plate 2521, specifically at a side of the display module 23 away from the flexible support plate 26. The second connecting plates 2522 of the two connecting structures 252 are close to each other in the second direction. The second connecting plate 2522 covers a partial edge of the display module 23. Specifically, the arc-shaped connecting section covers the edge of the curled part 231 of the display module 23, and the two flat connecting sections cover the edge of the first flat part 232 and the edge of the second flat part 233.

The fixed structure further includes a second fixed housing 12. The second fixed housing 12 includes a first part 121, an adapter part 122 and a second part 123. The first part 121 is fixedly connected to the first fixed housing 11. The adapter part 122 is connected to the first part 121, and extends along the third direction towards a direction close to the first fixed housing 11. The second part 123 is connected to one end of the adapter part 122 close to the first fixed housing 11. An installation space is formed between the second fixed housing 12 and the first fixed housing 11. Branch edges 124 are arranged at two sides, in the second direction, of the second fixed housing 12. The branch edge 124 extends along the first direction. The branch edge 124 is located in the same plane as the first part 121, and is integrally formed with the first part 121. The second connecting plate 2522 of the connecting structure 252 is connected to a side of the branch edge 124 close to the first fixed housing 11 in the third direction.

The sliding mechanism further includes a cover plate 28. The cover plate 28 is located at a side of the second fixed housing 12 away from the first fixed housing 11 in the third direction, and specifically connected to a side of the sliding housing 25 away from the first fixed housing 11 in the third direction, where the third direction is perpendicular to the first direction and the second direction. The second flat part 233 of the display module 23 is located between the cover plate 28 and the second part 123 in the third direction. When the driving support mechanism drives the connecting frame 21 to move along the first direction, the driving support mechanism drives the track plate 24 and the sliding housing 25 to move together with the connecting frame 21, and the sliding housing 25 drives the cover plate 28 to move. When the cover plate 28 moves along the first direction to come into contact with the adapter part 122 of the second fixed housing 12, an accommodating space may be formed between the cover plate 28 and the second part 123, and at this time, the second flat part 233 is located in the accommodating space. The second flat part 233 of the display module 23 is covered and protected by the cover plate 28 and the second fixed housing 12.

It can be understood that the sliding housing 25 can cover and protect the curled part 231 of the display module 23, and the cover plate 28 can cover and protect the second flat part 233 of the display module 23.

As shown in FIGS. 7 to 10, the flexible display device also includes a driving support mechanism. The driving support mechanism is configured to drive the installation part 211 of the connecting frame 21 to move along the first direction. The driving support mechanism is arranged in the installation space. The driving support mechanism includes one pair of driving mechanisms 31, and one pair of driving mechanisms 31 includes two driving mechanisms 31 distributed along the second direction. The two driving mechanisms 31 are symmetrically arranged about a center line of the first fixed housing 11, where the center line is along the first direction. The driving mechanism 31 includes a motor 311 and a driving member 312. The fixed part of the driving mechanism 31 includes a shell 3111 of the motor 311, and the movable part of the driving mechanism includes a rotation shaft 3112 of the motor 311 and the driving member 312. The shell 3111 of the motor 311 is arranged on the first fixed plate 111. The rotation shaft 3112 of the motor 311 is threadedly connected to one end of the driving member 312. When the rotation shaft 3112 of the motor 311 rotates, the driving member 312 can be caused to move along the first direction.

The driving mechanism 31 further includes a second guiding member 313. The second guiding member 313 is connected to the first fixed housing 11. The second guiding member 313 extends along the first direction and is spaced apart from the driving member 312 in the second direction. The driving member 312 is provided with a driving connection part extending along the second direction. The driving connection part is slidably connected to the second guiding member 313. The second guiding member 313 may be a guiding rail. The driving connection part may be connected to an outer side of the second guiding member 313; or a sliding rail may be arranged on the second guiding member 313, and the driving connection part is clamped in the sliding rail. In this embodiment, the driving member 312 may be arranged as a plate-shaped structure, which can reduce the occupied space while ensuring the connection stability.

The driving support mechanism also includes a first guiding member 32 and a plurality of support brackets 33. The first guiding member 32 is a strip-shaped structure, and extends along the second direction. The first guiding member 32 is located between the first fixed housing 11 and the connecting frame 21 in the first direction. The first guiding member 32 is fixedly connected to another end of the driving member 312. When the driving member 312 moves along the first direction, the driving member can drive the first guiding member 32 to move in sync with it. The plurality of the support brackets 33 are arranged between the first fixed housing 11 and the connecting frame 21 in the first direction. A plurality of first connecting parts 1111 are arranged on the first fixed housing 11 along the second direction, and a plurality of second connecting parts 2111 are arranged on the connecting frame 21 along the second direction. Each first connecting part 1111 and each second connecting part 2111 are provided with a support bracket 33 therebetween. Along the first direction, the first connecting part 1111 and the second connecting part 2111 at two ends of the support bracket 33 are located in the same straight line. One end of the support bracket 33 is hingedly connected to one of the first connecting parts 1111, and another end of the support bracket 33 is hingedly connected to the second connecting part 2111.

The support bracket 33 includes two support units 331. One end of each of the two support units 331 is hingedly connected to the second connecting part 2111, and another end of each of the two support units 331 is hingedly connected to the first connecting part 1111. The support unit 331 includes a first connecting member 3311 and a second connecting member 3312. One end of the first connecting member 3311 is hingedly connected to the second connecting part 2111, and another end of the first connecting member 3311 is slidably connected to the first guiding member 32. One end of the second connecting member 3312 is rotatably connected to the another end of the first connecting member 3311, and another end of the second connecting member 3312 is hingedly connected to the first connecting part 1111. A slider 332 is provided at a connection between the second connecting member 3312 and the first connecting member 3311. The slider 332 is slidably connected to the first guiding member 32. It should be emphasized that there is no relative movement between the slider 332 and the connection between the second connecting member 3312 and the first connecting member 3311, but the slider can slide on the first guiding member 32. A sliding track 321 is provided on the first guiding member 32, and the slider 332 may be slidably connected in the sliding track 321.

In order to keep the force received by the first guiding member 32 balanced during the sliding of the slider 332, the length of the first connecting rod may be arranged to be equal to the length of the second connecting rod. In this way, the forces received at the connection between the first connecting rod and the second connecting rod cancel each other in the first direction and superimpose each other in the second direction, and together drive the slider 332 to slide on the first guiding member 32. During the slide winding of the display module 23, in order to prevent two adjacent support brackets 33 from interfering with each other and causing a limitation on the amount of slide winding of the display module 23, the distance between two adjacent first connecting parts 1111 is greater than or equal to the sum of the lengths of two first connecting rods, and the distance between two adjacent second connecting parts 2111 is greater than or equal to the sum of the lengths of two second connecting rods. In this way, the first connecting rods of two adjacent support brackets 33 do not come into contact even when the angle between the two first connecting rods of the same support bracket 33 becomes 180 degrees, and the second connecting rods of two adjacent support brackets 33 do not come into contact even when the angle between the two second connecting rods of the same support bracket 33 becomes 180 degrees.

In order to prevent the first connecting member 3311 and the second connecting member 3312 of the support unit 331 from being stuck during relative rotation, it is required to ensure that the first connecting member 3311 and the second connecting member 3312 are always under the force in the second direction. Therefore, the angle between the first connecting member 3311 and the first guiding member 32 is not equal to 90 degrees, and the angle between the second connecting member 3312 and the first guiding member 32 is not equal to 90 degrees, i.e., the angle between the first connecting member 3311 and the second connecting member 3312 of the same support bracket 33 is always less than 180 degrees. During the sliding of the slider 332 along the first guiding member 32, the two support units 331 always remain symmetrical about the connection line between the first connecting part 1111 and the second connecting part 2111, i.e., the first connecting rods and the second connecting rods of the two support units 331 form the diamond-shaped support bracket 33.

When the flexible display device is in the folded state, the first connecting rods of the two support units 331 are arranged in the same straight line in the second direction and are attached to the installation part 211, and the second connecting rods of the two support units 331 are arranged in the same straight line in the second direction and are attached to the first fixed plate 111. When the first guiding member 32 moves away from the first fixed housing 11 along the first direction, the angle between the first connecting rods of the two support units 331 becomes smaller, the angle between the second connecting rods of the two support units 331 becomes smaller, the angle between the first connecting rod and the second connecting rod of the same support unit 331 gradually becomes larger, and the two sliders 332 are forced to be close to each other on the first guiding member 32 along the second direction. At this time, the distance between the first guiding member 32 and the first fixed housing 11 in the first direction gradually increases, and the distance between the installation part 211 of the connecting frame 21 and the first guiding member 32 in the first direction also gradually increases. When the flexible display device changes from the slide open state to the retracted state, the movement of the components of the driving support mechanism is in the opposite manner, which will not be repeated herein.

It should be noted that the first guiding member 32 is located at a side of the driving member 312 close to the first fixed plate 111 in the third direction, the support bracket 33 is located at a side of the first guiding member 32 close to the first fixed plate 111 in the third direction, and the flexible support plate 26 is bonded to a side of the display module 23 close to the support bracket 33 and the rolling shaft 22. The structure of the support bracket 33 and the structure of the first guiding member 32 are relatively simple and easy to install. In the third direction, the first guiding member 32 and the support bracket 33 do not take up excess space, which is conducive to the lightening and thinning of the flexible display device. It should be understood that, whether in the folded state or during the sliding and unfolding process, the support bracket 33 provides support for the flexible support plate 26 all the time.

During the unfolding process of the flexible display device, the rotation shaft 3112 of the motor 311 rotates to drive the driving member 312 to slide along the first direction, pushing the driving member 312 to extend towards the first direction. The two motors 311 are activated at the same time, so the two driving members 312 have the same extension length, pushing the first guiding member 32 to translate only along the first direction. While the first guiding member 32 moves along the first direction, it pushes the plurality of the support brackets 33 to synchronously unfold along the first direction. When the support bracket 33 is unfolded, it drives the connecting frame 21 to move along the first direction, at which time the rolling shaft 22 drives, in the form of the rolling friction, the flexible support plate 26 to slide, and the display module 23 moves with the flexible support plate 26 simultaneously, thereby realizing slide opening and retraction of the display module 23. It is worth noting that, except for the driving member 312 in the motor 311 moving along the first direction, the second guiding member 313 restricts all degrees of freedom of the driving member 312 except for the first direction to ensure smoothness during the movement process.

During the unfolding process of the flexible display device, when the movement stroke of the motor 311 along the first direction is L, the movement stroke of the first guiding member 32 along the first direction is also L, the movement stroke of the slider 332 cooperated with the first guiding member 32 is also L, and the movement stroke of the first connecting rod and the movement stroke of the second connecting rod are both L. Therefore, the stroke of the support bracket 33 is 2L. When the movement stroke of the support bracket 33 is 2L, the movement stroke of the connecting frame 21 is also 2L, then the rotation stroke of the rolling shaft 22 installed on the connecting frame 21 is also 2L. The movement stroke of the curled part 231 is the same as the rotation stroke of the rolling shaft 22, and is also 2L, then the length of the first flat part 232 is increased by 2L, and the length of the second flat part 233 is decreased by 2L. Thus, the total stroke of the display module 232 is 4L. The first flat part 232 is the display area of the display module 23, and the display area is enlarged in size by 2L along the first direction.

Figure 2:
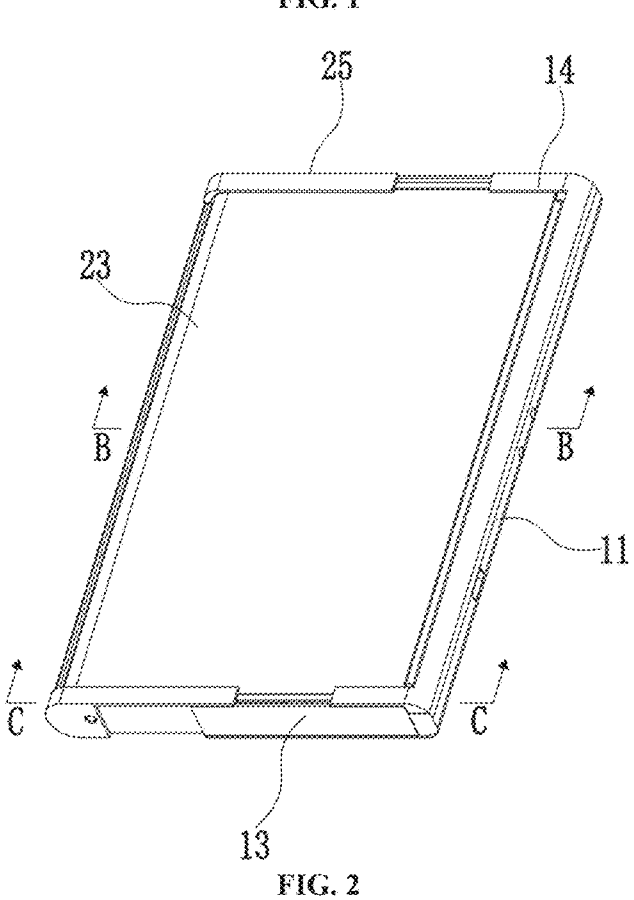
FIG. 2 is a schematic structural diagram of a flexible display device when it is unfolded involved in an embodiment of the present disclosure.
Figure 3:
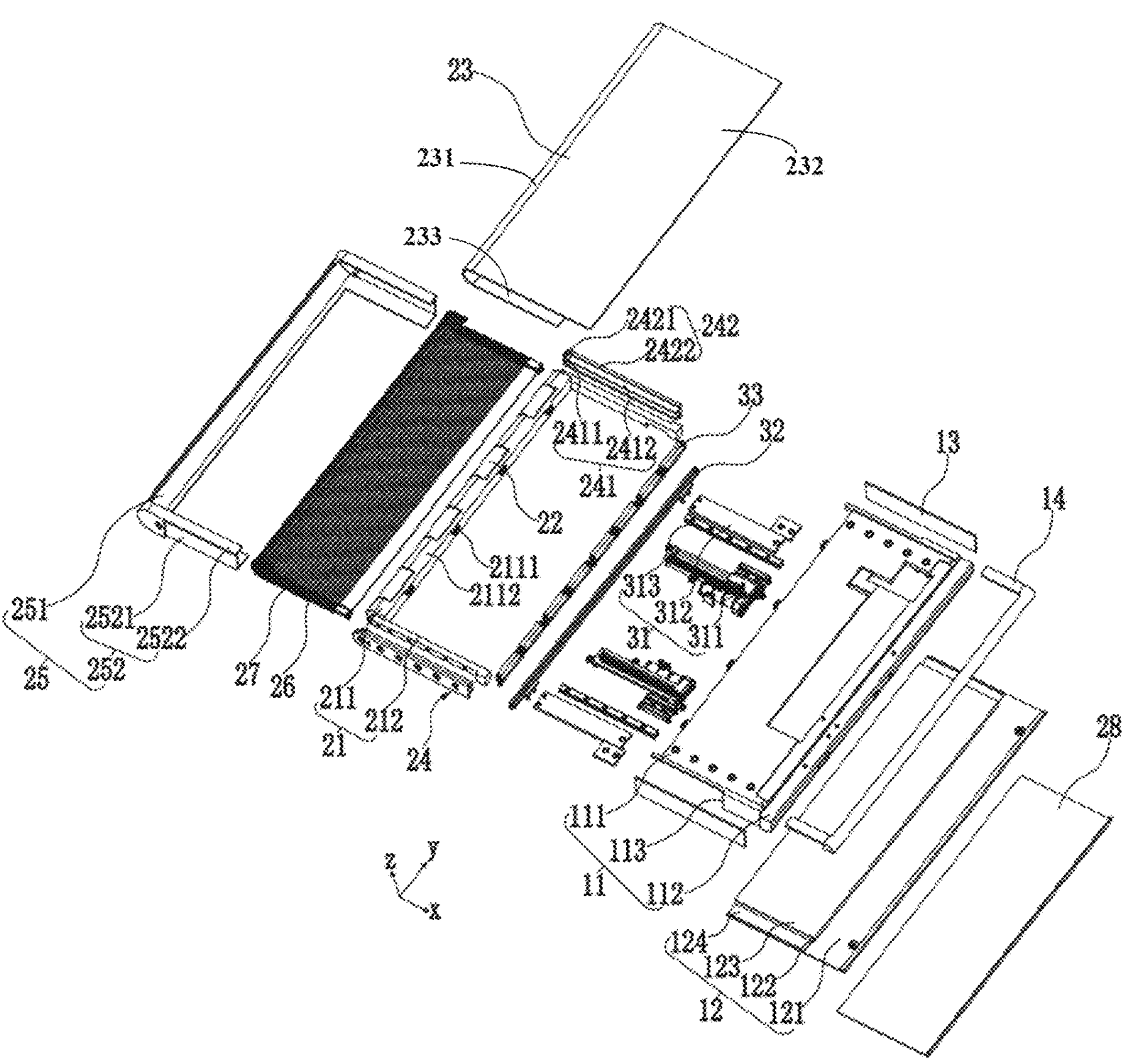
FIG. 3 is an exploded view of a flexible display device involved in an embodiment of the present disclosure.
Figure 4:
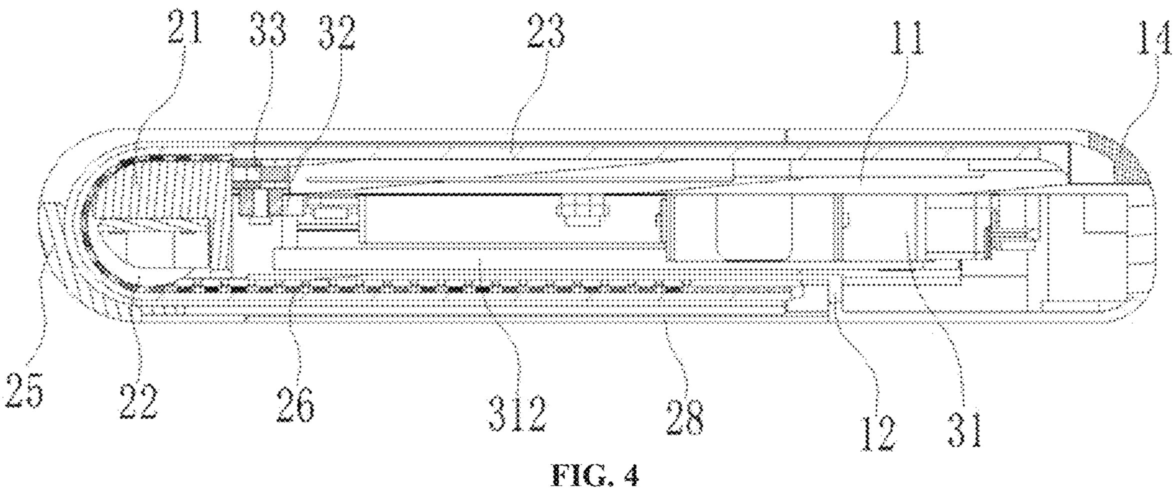
FIG. 4 is a schematic diagram of a structure in an A-A cross-sectional direction of FIG. 1.
Figure 5:
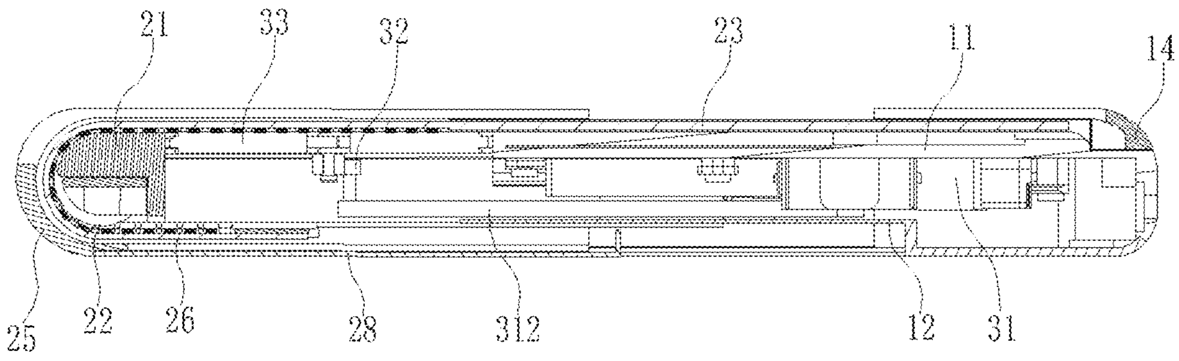
FIG. 5 is a schematic diagram of a structure in a B-B cross-sectional direction of FIG. 2.
Figure 6:
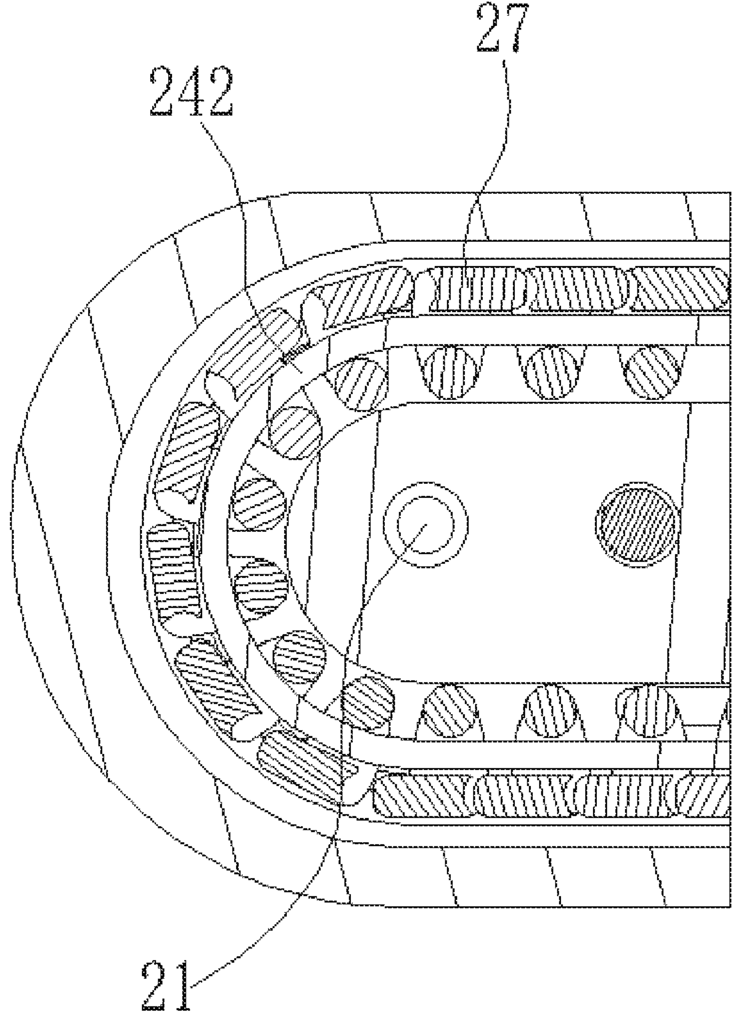
FIG. 6 is a schematic diagram of a partial structure in a C-C cross-sectional direction of FIG. 2.
Figure 7:
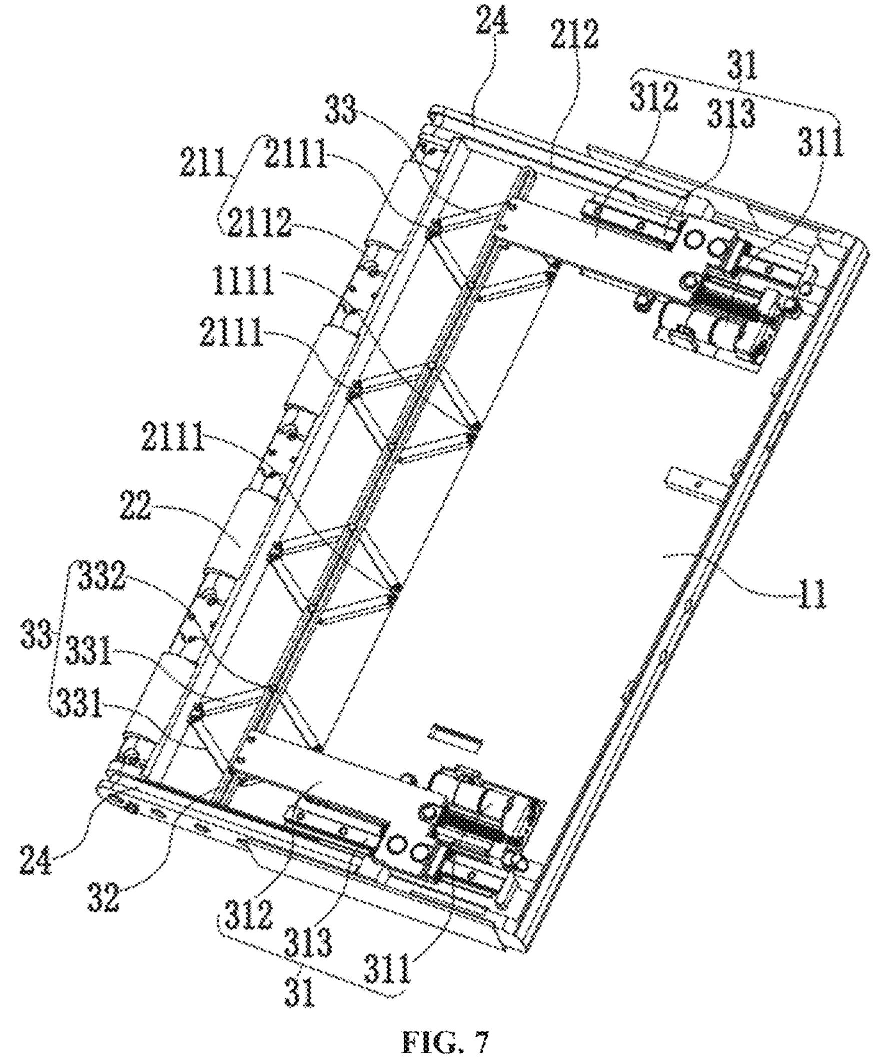
FIG. 7 is a schematic diagram of a partial structure in a flexible display device involved in an embodiment of the present disclosure.
Figure 8:
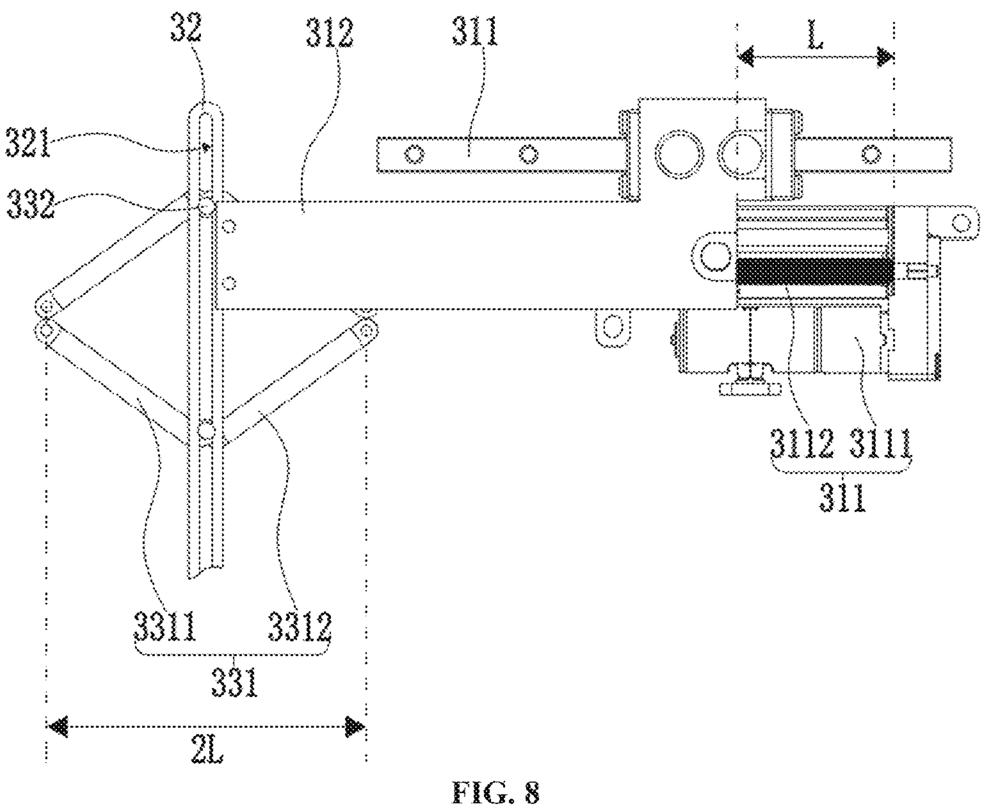
FIG. 8 is a schematic structural diagram of a driving support mechanism involved in an embodiment of the present disclosure.
Figure 9:
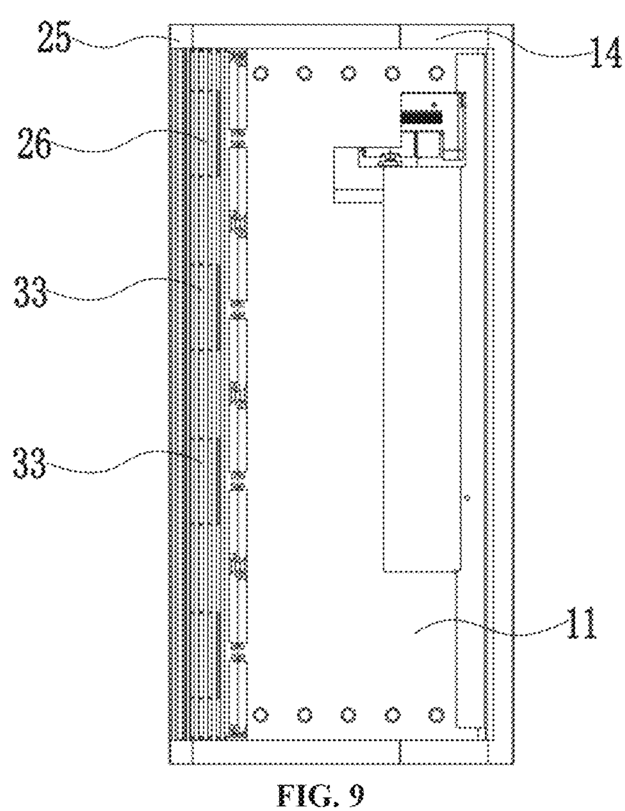
FIG. 9 is another schematic structural diagram of a flexible display device when it is folded involved in an embodiment of the present disclosure.
Figure 10:
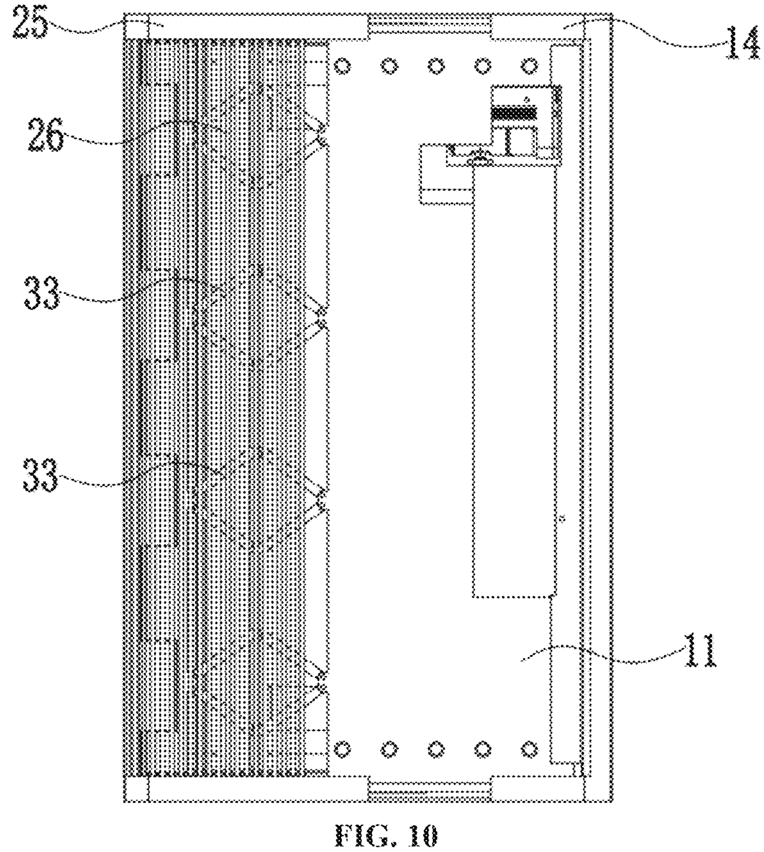
FIG. 10 is another schematic structural diagram of a flexible display device when it is unfolded involved in an embodiment of the present disclosure.

As shown in FIGS. 1 and 2, the fixed structure further includes a first cover housing 13 and a second cover housing 14. The first cover housing 13 and the second cover housing 14 are fixedly connected to the first fixed housing by bolts. The first cover housing 13 is located at two sides of the first fixed housing 11 along the second direction and is at least partially overlapped with the first connecting plate 2521. The second cover housing 14 is partially located at a side of the display module 23 away from the first fixed housing 11 and covers a portion of the edge of the display module 23 that is not covered by the second connecting plate 2522. A chute is provided at a side of the connecting structure 252 away from the track plate 24 along the second direction, and the first cover housing 13 is matched in the chute. It should be understood that the first cover housing 13 and the second cover housing 14 serve to prevent the structure inside the flexible display device from becoming exposed.

It should be noted that the flexible display device includes other necessary parts and compositions in addition to the fixed structure, the sliding mechanism and the driving support mechanism. Taking a display as an example, specifically, for example, a circuit board, a power supply line, etc. may be included. Those skilled in the art may perform supplementing accordingly according to the specific using requirements of the flexible display device, which will not be repeated herein.

The flexible display device may be a traditional electronic device, such as a cell phone, a computer, a television, and a camcorder, or it may be an emerging wearable device, such as VR glasses, which will not be listed one by one herein.

The present application is intended to cover any variations, uses or adaptive changes of the present disclosure, and the variations, uses or adaptive changes follow the general principles of the present disclosure and include common knowledge or customary technical means in the art not disclosed in the present disclosure. The specification and embodiments are only considered exemplary, and the true scope and spirit of the present disclosure are indicated by the claims.

It should be understood that the present disclosure is not limited to the precise structure described above and shown in the accompanying drawings, and various modifications and changes can be made without departing from its scope. The scope of the present disclosure is limited only by the appended claims.

What is claimed is:

1. A flexible display device, comprising:

a fixed structure, comprising a first fixed housing;

a sliding mechanism, comprising a display module, a connecting frame and a rolling shaft, wherein the connecting frame comprises an installation part, the installation part is spaced apart from and arranged at a side of the first fixed housing along a first direction, the rolling shaft is rotatably connected to the connecting frame, and the display module is wound around the rolling shaft and connected to the first fixed housing; and a driving support mechanism, comprising at least one driving mechanism, a first guiding member and at least one support bracket, wherein the first guiding member is arranged between the first fixed housing and the connecting frame, a fixed part of the driving mechanism is installed on the first fixed housing, a movable part of the driving mechanism is fixedly connected to the first guiding member, the support bracket comprises at least one support unit, the support unit comprises a first connecting member, one end of the first connecting member is hingedly connected to the connecting frame, another end of the first connecting member is slidably connected to the first guiding member, and an angle between the first connecting member and the first guiding member is not equal to 90 degrees.

2. The flexible display device according to claim 1, wherein the support unit further comprises a second connecting member, one end of the second connecting member is rotatably connected to the another end of the first connecting member, a slider is provided at a connection between the second connecting member and the first connecting member, the slider is slidably connected to the first guiding member, another end of the second connecting member is hingedly connected to the first fixed housing, and an angle between the second connecting member and the first guiding member is not equal to 90 degrees.

3. The flexible display device according to claim 2, wherein the first fixed housing is provided with a first connecting part, the connecting frame is provided with a second connecting part, the support bracket comprises two support units, first connecting members of the two support units are hingedly connected to the second connecting part, and second connecting members of the two support units are hingedly connected to the first connecting part.

4. The flexible display device according to claim 3, wherein a distance between two adjacent first connecting parts is greater than or equal to a sum of lengths of two first connecting members, a distance between two adjacent second connecting parts is greater than or equal to a sum of lengths of two second connecting members, and the first connecting member and the second connecting member have equal lengths.

5. The flexible display device according to claim 1, wherein the driving support mechanism comprises a plurality of support brackets, the plurality of the support brackets are arranged sequentially along a second direction, and the second direction is perpendicular to the first direction.

6. The flexible display device according to claim 5, wherein the sliding mechanism further comprises a flexible support plate, the flexible support plate is fixed to the display module, and the flexible support plate is located partially between the support bracket and the display module and partially between the rolling shaft and the display module.

7. The flexible display device according to claim 6, wherein the connecting frame further comprises connecting arms, the connecting arms are arranged at two sides of the installation part along the second direction and extend along the first direction towards a direction close to the first fixed housing, track plates are arranged at two sides of the connecting arms, a guiding strip is arranged at a side of the track plate close to the connecting arm, a guiding member is slidably connected to the guiding strip, and the guiding member is fixedly connected to the flexible support plate.

8. The flexible display device according to claim 7, wherein the sliding mechanism further comprises a sliding housing, the sliding housing comprises an arc-shaped plate, the arc-shaped plate is located at a side of a curled part of the display module away from the rolling shaft, connecting structures are provided at two ends, in the second direction, of the arc-shaped plate respectively, and the connecting structure extends along the first direction and is connected to at least one of the track plate or the connecting arm.

9. The flexible display device according to claim 8, wherein the connecting structure comprises a first connecting plate and a second connecting plate, the first connecting plate is arranged at a side of the track plate away from the connecting arm, the second connecting plate is arranged at an outer edge of the first connecting plate and located at a side of the display module away from the flexible support plate, and the second connecting plate covers a partial edge of the display module.

10. The flexible display device according to claim 9, wherein the sliding mechanism further comprises a cover plate, the cover plate is arranged, along a third direction, at a side of the sliding housing away from the first fixed housing, the third direction is perpendicular to the first direction and the second direction, and the display module extends from the rolling shaft to an area between the flexible support plate and the cover plate.

11. The flexible display device according to claim 10, wherein the fixed structure further comprises a second fixed housing, the second fixed housing is arranged at a side of the driving support mechanism away from the first fixed housing, the second fixed housing comprises a first part, an adapter part and a second part, the first part is fixedly connected to the first fixed housing, the adapter part is connected to the first part and extends along the third direction towards the first fixed housing, the second part is connected to an end of the adapter part close to the first fixed housing, and the display module is located between the cover plate and the second part in the third direction.

12. The flexible display device according to claim 11, wherein along the second direction, branch edges are provided at two sides of the second fixed housing, the branch edge is located in a same plane as the first part, and the second connecting plate is connected to a side of the branch edge close to the first fixed housing.

13. The flexible display device according to claim 9, wherein the fixed structure further comprises a first cover housing and a second cover housing, the first cover housing and the second cover housing are fixedly connected to the first fixed housing, the first cover housing is located at two sides of the first fixed housing along the second direction and is at least partially overlapped with the first connecting plate, and the second cover housing is partially arranged at a side of the display module away from the first fixed housing and covers a portion of an edge of the display module not covered by the second connecting plate.

14. The flexible display device according to claim 13, wherein a chute is provided at a side of the connecting structure away from the track plate along the second direction, and the first cover housing is matched in the chute.

15. The flexible display device according to claim 1, wherein the driving mechanism comprises a motor and a driving member, the motor is arranged on the first fixed housing, one end of the driving member is threadedly connected to a rotation shaft of the motor, and another end of the driving member is fixedly connected to the first guiding member.

16. The flexible display device according to claim 15, wherein the driving mechanism further comprises a second guiding member, the second guiding member is connected to the first fixed housing, the second guiding member extends along the first direction, and the driving member is slidably connected to the second guiding member.

17. The flexible display device according to claim 16, wherein the driving support mechanism comprises at least one pair of driving mechanisms, one pair of driving mechanisms comprises two driving mechanisms, the two driving mechanisms of each pair of driving mechanisms are symmetrically arranged about a center line, along the first direction, of the first fixed housing.

* * * * *